United States Patent [19]
Kusakabe

[11] Patent Number: 5,635,875
[45] Date of Patent: Jun. 3, 1997

[54] PLL CIRCUIT WITH IMPROVED STABILITY

[75] Inventor: Mitsuo Kusakabe, Itami, Japan

[73] Assignee: Mitsubishi Denki Kabushiki Kaisha, Tokyo, Japan

[21] Appl. No.: 203,173

[22] Filed: Feb. 25, 1994

[30] Foreign Application Priority Data

Mar. 2, 1993 [JP] Japan .................................. 5-040974
Dec. 13, 1993 [JP] Japan .................................. 5-311726

[51] Int. Cl.$^6$ .................................................. H03L 7/06
[52] U.S. Cl. ................. 331/1 A; 331/25; 331/DIG. 2; 327/156; 327/160; 375/376; 375/374
[58] Field of Search .................. 331/1 A, 17, 14, 331/18, 25, DIG. 2; 375/376, 374; 327/156, 159, 160

[56] References Cited

U.S. PATENT DOCUMENTS

| | | | |
|---|---|---|---|
| 3,882,412 | 5/1975 | Apple, Jr. ............................... | 331/1 A |
| 4,380,742 | 4/1983 | Hart ........................................ | 331/1 A |
| 4,531,102 | 7/1985 | Whitlock et al. ...................... | 331/1 A |
| 4,695,931 | 9/1987 | Yamaura et al. ....................... | 363/8 |
| 4,931,748 | 6/1990 | McDermott et al. .................. | 331/1 A |
| 5,028,885 | 7/1991 | Voigt et al. ............................ | 331/1 A |

FOREIGN PATENT DOCUMENTS

| | | |
|---|---|---|
| 3441226 | 5/1986 | Germany . |
| 60-142622 | 7/1985 | Japan . |
| 61-277211 | 12/1986 | Japan . |
| 3240216 | 5/1988 | Japan . |
| 63-240216 | 10/1988 | Japan . |
| 3-211911 | 9/1991 | Japan . |
| 4-104519 | 4/1992 | Japan . |
| 4-196715 | 7/1992 | Japan . |

Primary Examiner—Robert Pascal
Assistant Examiner—Arnold Kinkead
Attorney, Agent, or Firm—Lowe, Price, LeBlanc & Becker

[57] ABSTRACT

A PLL circuit detects a phase difference between a signal relating to an output of a voltage control oscillator and a reference signal, and discrimination between a phase lead and a phase lag, increments or decrements a preset value by the number of pulses corresponding to the detected phase difference in accordance with the detected discrimination between the phase lead and the phase lag, converts the count value into a corresponding voltage, and feedbacks the voltage to the voltage control oscillator. When the reference signal is stopped, the count operation is halted. A plurality of values including an initial value for the value required in the count operation are previously stored, and a desired value is selected from these values.

8 Claims, 12 Drawing Sheets

PLL CIRCUIT WITH IMPROVED STABILITY

BACKGROUND OF THE INVENTION

1. Field of the Invention

The invention relates to a phase-locked loop circuit (PLL circuit).

2. Description of the Related Art

FIG. 1 is a block diagram of a prior art PLL circuit. A voltage control oscillator 1 is a free-running oscillator which oscillates at a frequency corresponding to an input voltage. The oscillation frequency $f_V$ of the oscillator is divided by p in a frequency divider 3, and then supplied as a signal V to a phase comparator 5. A reference signal generator 2 consists of, for example, a quartz oscillator. The output frequency of the reference signal generator is set so as to be lower than the oscillation frequency of the voltage control oscillator 1. The output frequency $f_R$ of the reference signal generator is divided by q in a frequency divider 4, and then supplied as a signal R to the phase comparator 5. The phase comparator 5 compares the two inputs with each other, and the comparison result is output to a low-pass filter 6. The low-pass filter 6 generates an analog voltage which corresponds to the extent of the comparison result, and feedbacks the analog voltage to the voltage control oscillator 1.

When the division ratio p:q of the frequency dividers 3 and 4 is set so that the frequency obtained by dividing the output frequency $f_V$ of the voltage control oscillator 1 by p in the frequency divider 3 equals to that obtained by dividing the output frequency $f_R$ of the reference signal generator 2 by q in the frequency divider 4, the following expression holds:

$$f_V/p = f_R/q \tag{1}$$

In Ex. (1), $$f_V > f_R \tag{2}$$

and, therefore, the following holds:

$$p > q \tag{3}$$

FIG. 2 is a circuit diagram showing a known example of the phase comparator 5 of FIG. 1. In the figure, a signal R is an input signal having a frequency which is obtained by dividing the output frequency $f_R$ of the reference signal generator 2 by q in the frequency divider 4, and a signal V is an input signal having a frequency which is obtained by dividing the output frequency $f_V$ of the voltage control oscillator 1 by p in the frequency divider 3. A signal U is an output signal of the phase comparator 5 which is output when the phase of the signal V lags that of the signal R, and a signal D is an output signal of the phase comparator 5 which is output when the phase of the signal V leads that of the signal R.

FIG. 3 is a timing chart showing the operation of the phase comparator 5 of FIG. 2. The signals U and D are "L" active. When the signals V and R are in-phase, both the signals U and D are "H". When the signal V lags the signal R, the signal U is "L" only during the period between the falling edge of the signal R and that of the signal V. When the signal V leads the signal R, the signal D is "L" only during the period between the falling edge of the signal V and that of the signal R. As seen from the above, the signals U and D are pulse signals having a time width which is equal to the phase difference between the signals R and V. During a period in which there is a phase difference, when the signal V leads, the signal D is output, and, when the signal V lags, the signal U is output. In other words, the signals U and D correspond to the frequency difference between the signals R and V, with the result that the deviation amount of the oscillation frequency of the voltage control oscillator 1 is converted into a time amount and then output as either of the signals U and D depending on the sign of the deviation. The signal U (D) is input to the low-pass filter 6 to be smoothed therein.

FIG. 4 is a circuit diagram showing an example of the low-pass filter 6 of FIG. 1. The signal U is input to the gate of a P-transistor 22, and the signal D is input to the gate of an N-transistor 23 via an inverter 21. The drains of the transistors 22 and 23 are connected to each other, and the junction point is connected to an output terminal via an active filter 24. In the active filter 24, a series circuit of a capacitor 25 and a resistor 26 is connected in parallel to an amplifier 27, and a resistor 28 is connected to one end of the parallel circuit.

When the signal U is "L" level, the P-transistor 22 is ON, and the capacitor 25 of the active filter 24 is charged. When the signal D is "L" level, the N-transistor 23 is ON, and the capacitor 25 is discharged. When both the signals U and D are "H" level, both the P-transistor 22 and the N-transistor 23 are OFF, and the charge held in the capacitor 25 remains to be held therein. When the total period of charge operations is long and the number of charge operations is large, the voltage of the output terminal becomes high, and this high voltage is feedbacked to the voltage control oscillator 1, with the result that the oscillation frequency is increased. When the total period of discharge operations is long and the number of discharge operations is large, the voltage of the output terminal becomes low, and this low voltage is feedbacked to the voltage control oscillator 1, with the result that the oscillation frequency is decreased. In the low-pass filter 6, as described above, the feedback voltage to the voltage control oscillator 1 is generated by processes of charging and discharging the capacitor 25. When the oscillation frequency of the voltage control oscillator 1 fluctuates, therefore, it requires a considerably prolonged period to return the oscillation frequency to the correct one.

Next, the operation of correcting the oscillation frequency $f_V$ which is deviated will be described. When the oscillation frequency $f_V$ of the voltage control oscillator 1 is decreased, the phase comparator 5 outputs the signal U which has information that the signal V ($f_V/p$) lags the signal R ($f_R/q$) and which indicates the phase difference between the signals. Accordingly, the capacitor 25 of the low-pass filter 6 is charged during the period in which the signal U is continued to be output, so that the feedback voltage is raised, with the result that the oscillation frequency $f_V$ of the voltage control oscillator 1 is increased.

When the oscillation frequency $f_V$ of the voltage control oscillator 1 is increased, the phase comparator 5 outputs the signal D which has information that the signal V leads the signal R and which indicates the phase difference between the signals. Accordingly, the capacitor 25 of the low-pass filter 6 is discharged during the period in which the signal D is continued to be output, so that the feedback voltage is lowered, with the result that the oscillation frequency $f_V$ of the voltage control oscillator 1 is decreased. This operation is repeated until Ex. (1) is satisfied, whereby the oscillation frequency $F_V$ is stabilized.

In the prior art PLL circuit described above, when the oscillation frequency $f_V$ of the voltage control oscillator 1 is deviated, the feedback voltage for correcting the deviation is generated depending on the charging and discharging characteristics of the capacitor 25 of the low-pass filter 6, thereby producing a problem in that a considerably prolonged time period must be elapsed until Ex. (1) is satisfied, or a problem of a reduced response. Furthermore, there is another problem in that, when the PLL circuit operates outside its operating range or runs away, it is difficult to control the operation of the PLL circuit.

In order to solve these problems, various methods have been proposed in which the output of a PLL circuit is digitized and the count value of a counter is converted into an analog value and then feedbacked to a voltage control oscillator. In the method disclosed in Japanese Patent Application Laid-Open No. 60-142622 (1985), the phase lead or phase lag is detected by an up-down counter, and the number of stages of an oscillator (ring oscillator) is changed. In the method disclosed in Japanese Patent Application Laid-Open No. 61-277211 (1986), the difference between the output frequency of a voltage control oscillator and a reference frequency is counted by an up-down counter, and a latch for setting the upper limit of the counter is provided to load the upper limit therein. In the method disclosed in Japanese Patent Application Laid-Open No. 3-211911 (1991), similarly, the difference between the output frequency of a voltage control oscillator and a reference frequency is counted by an up-down counter, and a correction value of a reference clock signal is calculated on the basis of the count value and previously stored characteristic data to obtain data of a control signal for feedback from the correction value. In the method disclosed in Japanese Patent Application Laid-Open No. 4-196715 (1992), a counter conducts the count operation in such a manner that, when the phase of an output signal of a voltage control oscillator lags that of a reference clock signal, the content is incremented, and, when the phase of the output signal leads that of the reference clock signal, the content is decremented, and the oscillation frequency of the voltage control oscillator is controlled by the output of the counter which has been converted into an analog value. Moreover, in the method disclosed in Japanese Patent Application Laid-Open No. 4-104519 (1992), a plurality of divided signals and an input signal from the outside are compared in phase with each other, and a control signal corresponding to the obtained phase difference is output to a voltage control oscillating unit. These prior art methods intend to provide a PLL circuit which has an excellent response or can rapidly recover the objective oscillation frequency.

When the supply of the reference signal is stopped, however, there arises a problem in that the whole of circuits including such a PLL circuit is disturbed and therefore it is impossible to control the circuits.

It is often that oscillation frequencies of a plurality of PLL circuits are switched so that they are used as sources for generating clock signals of higher and lower frequencies for a microcomputer. In such a case, there is a problem in that, when the frequency of a clock signal is switched to another one, a considerably prolonged time period must be elapsed until the oscillation frequency is stabilized and the starting of the microcomputer is delayed.

SUMMARY OF THE INVENTION

It is an object of the invention to provide a PLL circuit excellent in stability which, even when the supply of a reference signal is stopped, can continue the oscillation at the oscillation frequency obtained at the time when the reference signal supply is stopped.

It is another object of the invention to provide a PLL circuit in which the response can further be improved.

It is a further object of the invention to provide a PLL circuit excellent in controllablility in which, when the objective oscillation frequency is switched to another one, the oscillation can immediately be transferred to the new oscillation frequency.

The PLL circuit of the invention principally comprises: a phase comparator for detecting a phase difference between a signal relating to an output of a voltage control oscillator and a reference signal, and discrimination between the phase lead and the phase lag; a pulse generator for generating a pulse signal having pulses the number of which corresponds to the phase difference detected by the phase comparator; a counter for incrementing or decrementing a value which is previously set, by tile number of pulses in accordance with the discrimination between the phase lead and the phase lag which is detected by the phase comparator; and a converter for converting a count value of the counter into a voltage corresponding to the value, and the voltage is fed back to the voltage control oscillator. The pulse generator generates a pulse signal having pulses the number of which corresponds to the phase difference detected by the phase comparator. When the phase comparator detects the phase lag, tile counter increments the set value by the number of pulses, and, when the phase comparator detects a phase lead, the counter decrements the set value by the number of pulses. The converter converts the count value into a voltage corresponding to the incremented or decremented value. A correction voltage corresponding to the phase difference detected by the phase comparator is feedbacked to the voltage control oscillator.

The PLL circuit may comprise detecting means for detecting a stop of the output of the reference signal, and means for, when the output of the reference signal is stopped, halting the operation of the counter. When the reference signal is stopped, the operation of the counter is halted, and the voltage corresponding to the count value obtained at the stop is maintained and fed back to the voltage control oscillator. Even when the reference signal is stopped, therefore, the oscillation can be continued. Accordingly, in the case of an abnormal state of a reference signal generator, the PLL circuit can be prevented from running away, thereby enhancing the stability.

The PLL circuit may comprise means for previously storing an initial value which is set to the counter. Since an initial value corresponding to the objective oscillation frequency used at the time when the counter is reset, the initial value is rapidly set when the operation of the counter is to be restarted, thereby remarkably improving the response.

The PLL circuit may comprise storage means for storing a plurality of values which are to be set to the counter, and means for selecting a desired value from the storage means, and setting the selected value to the counter. Therefore, a value which is to be set to the counter can be selected. When the objective oscillation frequency is to be switched to another one, a value can immediately be set to the counter, thereby facilitating the control of switching the oscillation frequency and improving the controllability.

The above and further objects and features of the invention will more fully be apparent from the following detailed description with accompanying drawings.

DESCRIPTION OF THE PREFERRED EMBODIMENTS

Hereinafter, the invention will be described with reference to the drawings showing its embodiments.

Figure 1:
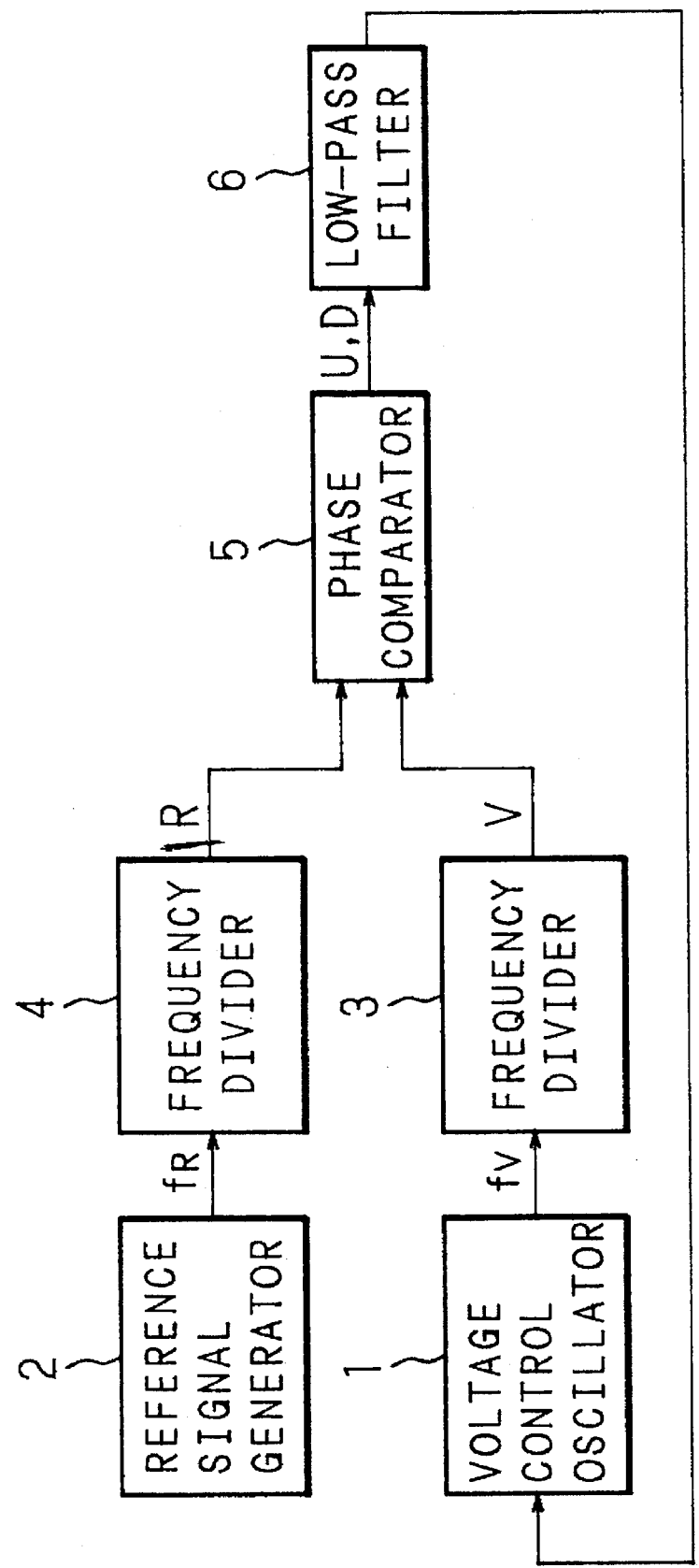
FIG. 1 is a block diagram of a prior art PLL circuit.
Figure 2:
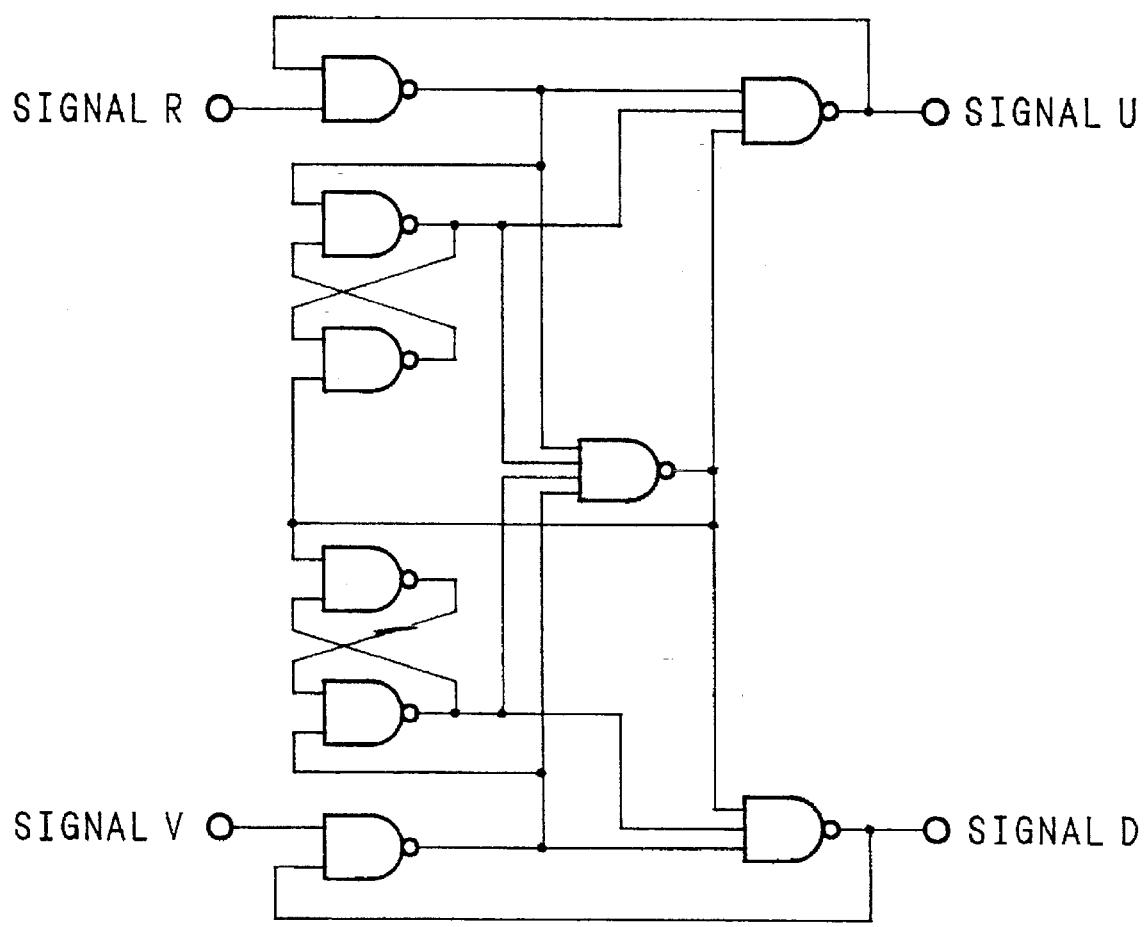
FIG. 2 is a circuit diagram of a phase comparator shown in FIG. 1.
Figure 3:
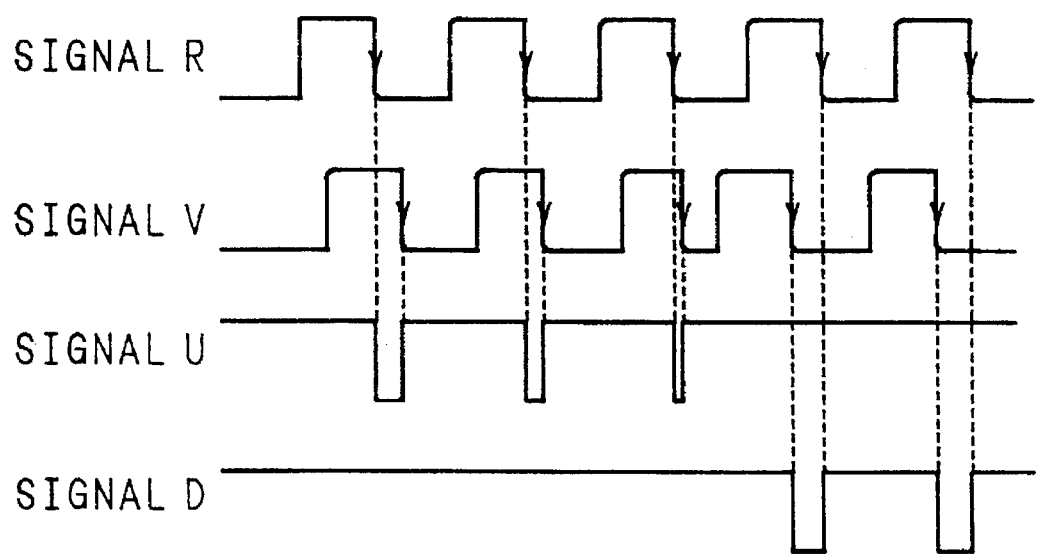
FIG. 3 is a timing chart of the phase comparator shown in FIG. 2.
Figure 4:
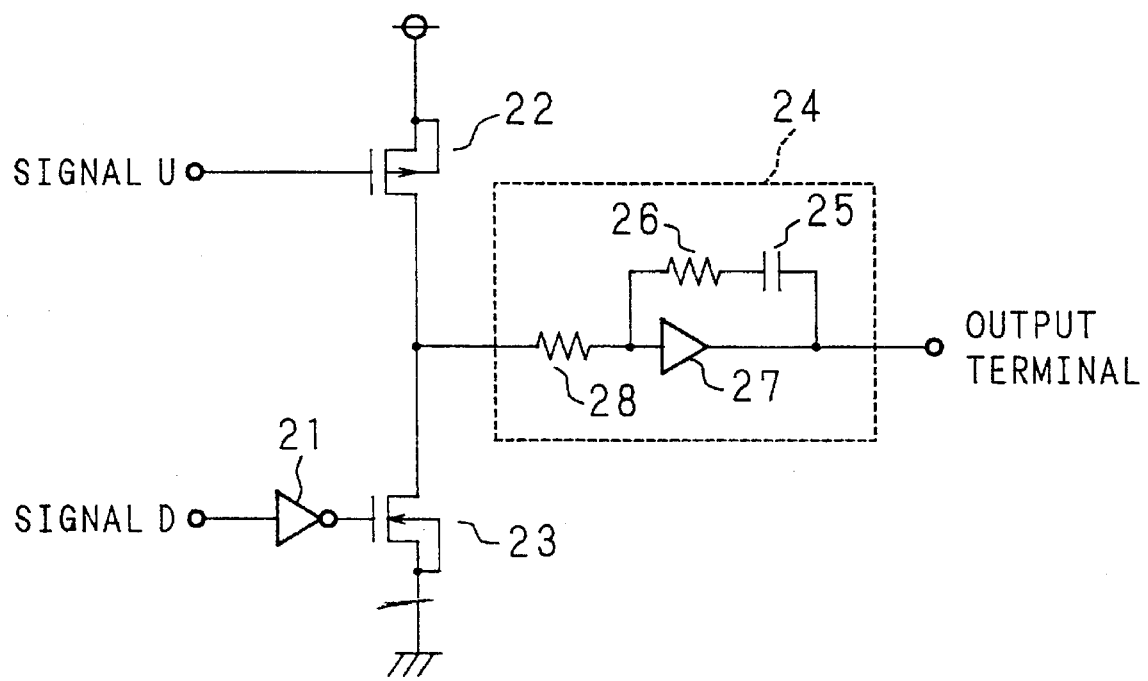
FIG. 4 is a circuit diagram of a low-pass filter shown in FIG. 1.
Figure 5:
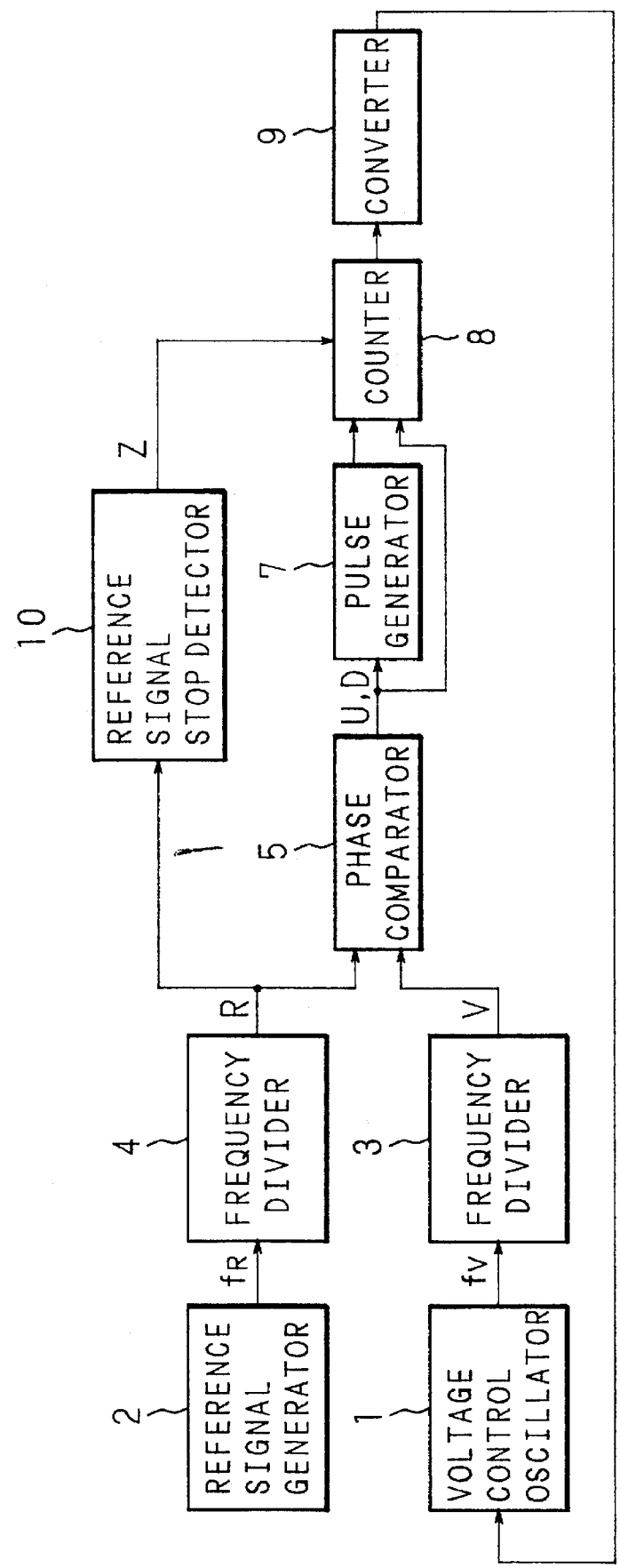
FIG. 5 is a block diagram of a PLL circuit of a first embodiment of the invention.

FIG. 5 is a block diagram of a first embodiment of the invention. In the figure, a voltage control oscillator 1 is a free-running oscillator which oscillates at a frequency corresponding to an input voltage. The oscillation frequency $f_V$ of the oscillator is divided by p in a frequency divider 3, and then supplied as a signal V to a phase comparator 5. A reference signal generator 2 consists of, for example, a quartz oscillator. The output frequency $f_R$ of the reference signal generator is divided by q in a frequency divider 4, and then supplied as a signal R to the phase comparator 6 and a reference signal stop detector 10. The phase comparator 6 compares the signals V and R with each other, and outputs a signal D when the phase of the signal V leads that of the signal R, and a signal U when the phase of the signal V lags that of the signal R. The phase comparator 5 outputs the signal U (D) in such a manner that the period of outputting the signal U (D) is equal to the time width of the phase difference between the signals V and R. The signal U (D) is supplied to a pulse generator 7 and a counter 8.

The pulse generator 7 generates a pulse signal having pulses the number of which corresponds to the period of outputting the signal U (D) (i.e., the period of "L" level), and supplies it to the counter 8. From a value which is previously set as the value corresponding to the objective oscillation frequency, the counter 8 counts the number of pulses. More specifically, when the oscillation frequency is deviated toward a lower (or higher) value, the value corresponding to the objective oscillation frequency is incremented (or decremented) by the number of pulses corresponding to the downward or upward deviation amount. When the oscillation frequency is stabilized, the signal U (D) is continued to have the state of "H" level, and the pulse generator 7 does not generate a pulse signal.

This counting operation is continued during a period in which the signal indicative of the phase difference is output. The count value is always output to a converter 9. The converter 9 generates a voltage corresponding to the count value and feedbacks it to the voltage control oscillator 1.

The reference signal stop detector 10 is a circuit for detecting a stop of the supply of a signal functioning as a reference from the reference signal generator 2. Namely, the reference signal stop detector 10 receives the output of the frequency divider 4, and monitors the output of a signal of the frequency which is obtained by dividing the output frequency $f_R$ of the reference signal generator 2. When a stop of the supply of the signal is detected, the reference signal stop detector 10 outputs a control signal Z of "L" level to the counter 8.

Figure 6:
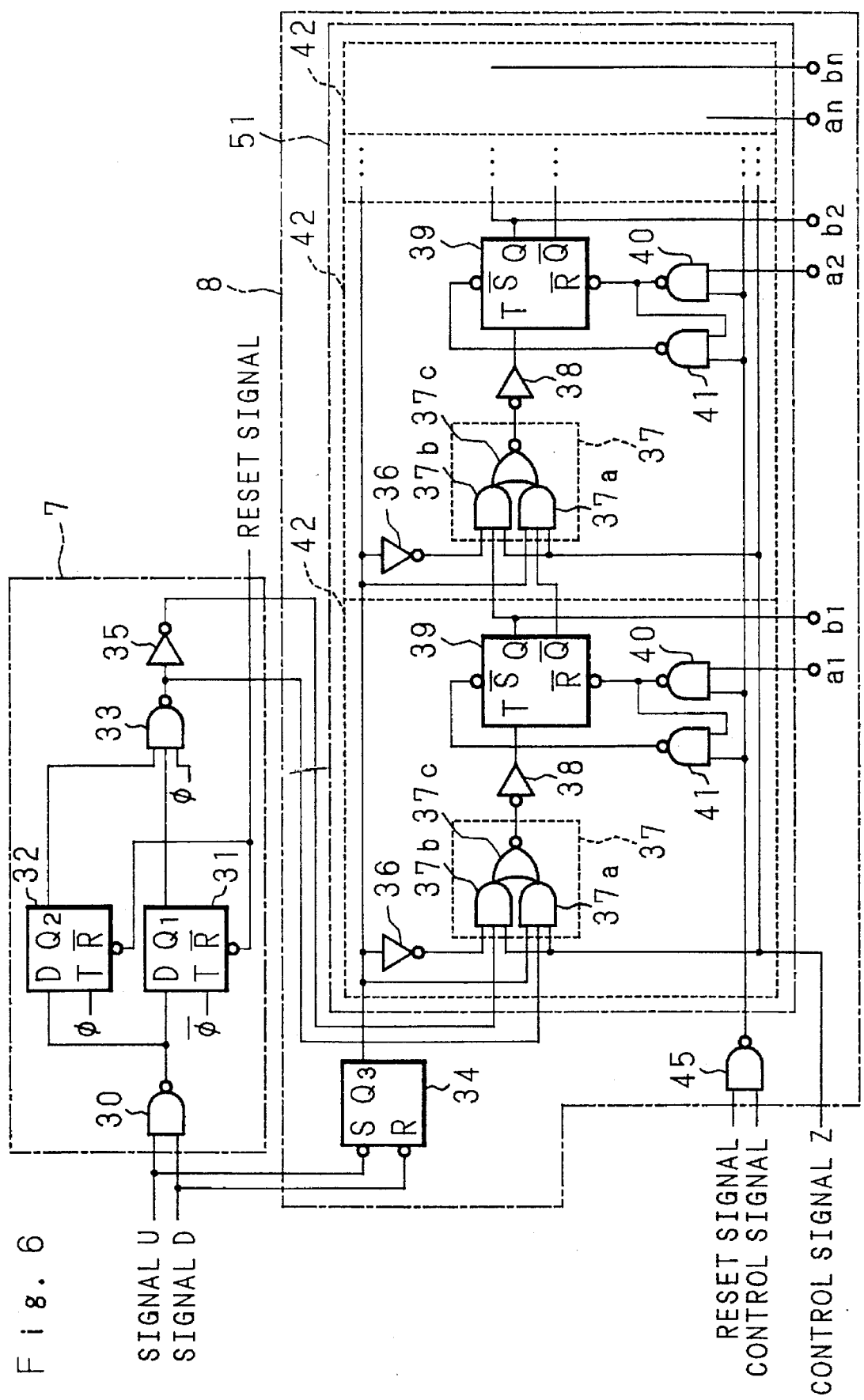
FIG. 6 is a circuit diagram of a pulse generator and a counter shown in FIG. 5.

FIG. 6 is a circuit diagram of the pulse generator 7 and the counter 8 shown in FIG. 5. The pulse generator 7 consists of a NAND gate 30, D-FFs 31 and 32, a 3-input NAND gate 33, and an inverter 35. The signals U and D are input to the D-FFs 31 and 32 via the NAND gate 30. The D-FFs 31 and 32 convert the time width of the "L" level of the signals U and D into an integer multiple of the period of a clock signal ϕ.

The clock signal ϕ and an inverted clock signal $\bar{\phi}$ for controlling the PLL circuit are given from a control circuit which is not shown. The clock signal ϕ is input to the terminal T of the D-FF 32, and the inverted clock signal $\bar{\phi}$ to the terminal T of the D-FF 31. A reset signal from the control circuit is input to the R terminal of each of the D-FFs 31 and 32. An output $Q_1$ of the D-FF 31, an output $Q_2$ of the D-FF 32, and the clock signal ϕ are input to the 3-input NAND gate 33. One of the outputs of the 3-input NAND gate 33 is input as an addend to a 3-input AND gate 37a of the counter 8, and the other output is input as a subtrahend to a 3-input AND gate 37b of the counter 8 via the inverter 35. The phase difference between the outputs $Q_1$ and $Q_2$ is a half period of the clock signal ϕ. When the signal U (D) has an output time width equal to or shorter than the half period, therefore, the pulse signal is not generated, and the signal U (D) is eliminated. The control signal Z from the reference signal stop detector 10 is supplied to a 2-AND-NOR gate 37 of each of bit blocks 42 of the counter 8.

Figure 7:
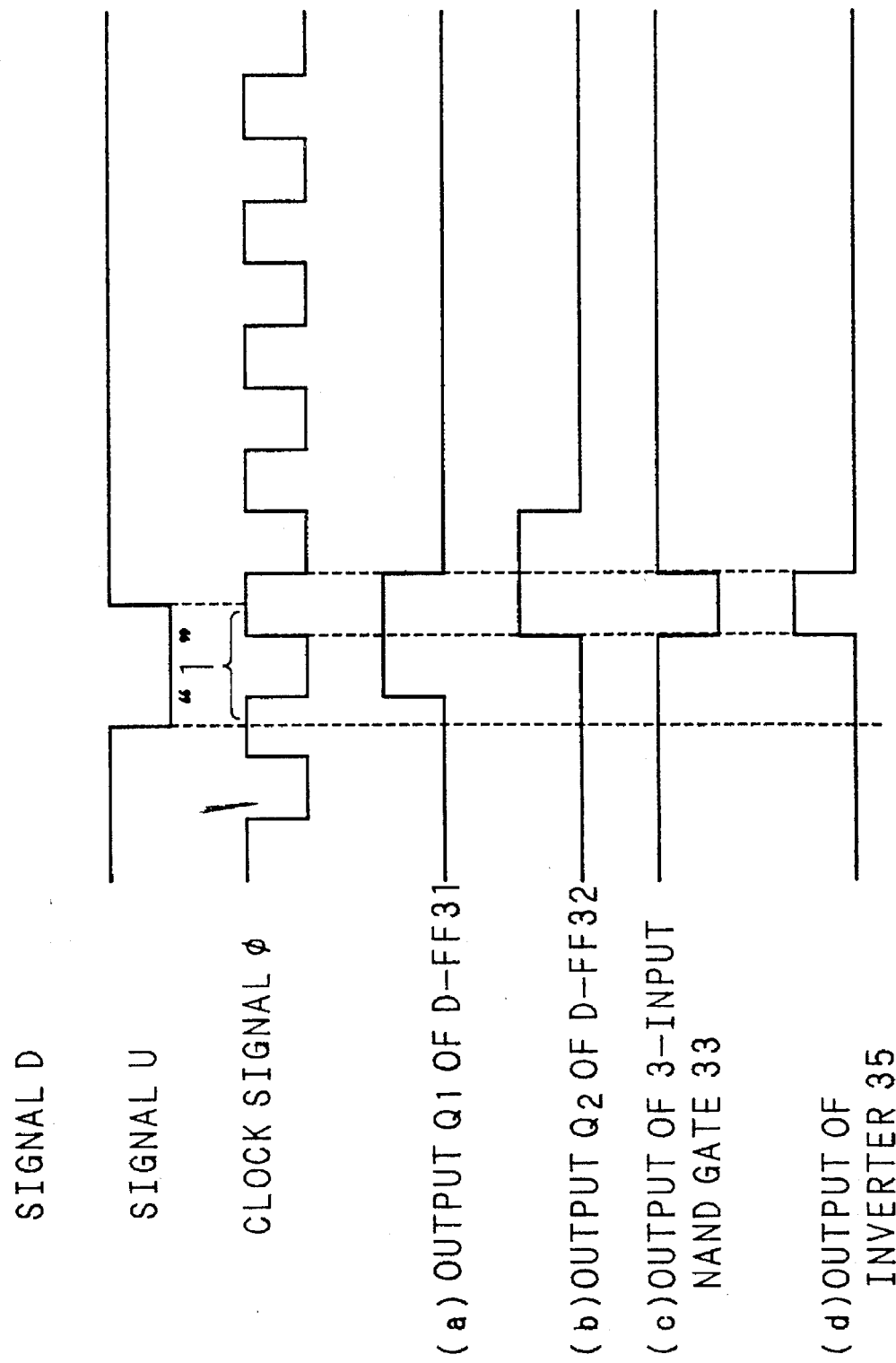
FIG. 7 is a timing chart of the pulse generator shown in FIG. 6.

FIG. 7 is a timing chart showing the operation of generating a pulse corresponding to the signal U in the pulse generator 7 shown in FIG. 6. The output $Q_1$ of the D-FF 31 is made "H" as shown in (a) of FIG. 7 at a first falling edge of the clock signal ϕ after a falling edge of the signal U, and the output $Q_2$ of the D-FF 32 is made "H" as shown in (b) of FIG. 7 at the rising edge after the elapse of a half period. The output $Q_1$ of the D-FF 31 is made "L" as shown in (a) of FIG. 7 at the next falling edge of the clock signal ϕ, and the output $Q_2$ of the D-FF 32 is made "L" as shown in (b) at the rising edge after the elapse of a half period. During the period in which both the outputs $Q_1$ and $Q_2$ ape "H", the 3-input NAND gate 33 is opened so that one positive pulse of the clock signal ϕ passes through the gate. In this way, when one negative-pulse period of the clock signal ϕ exists during an "L" level period of the signal U as indicated by "1" in FIG. 7, one pulse signal is output.

The output pulse of the 3-input NAND gate 33 is a negative pulse as shown in (c) of FIG. 7, and input to the counter 8 to function as addend "1". The output pulse of the inverter 35 which is shown in (d) is input to the counter 8. In the case that the signal U is output, however, the output of the inverter 35 does not function as subtrahend "1" because the 3-input AND Gate 37b is closed.

Figure 8:
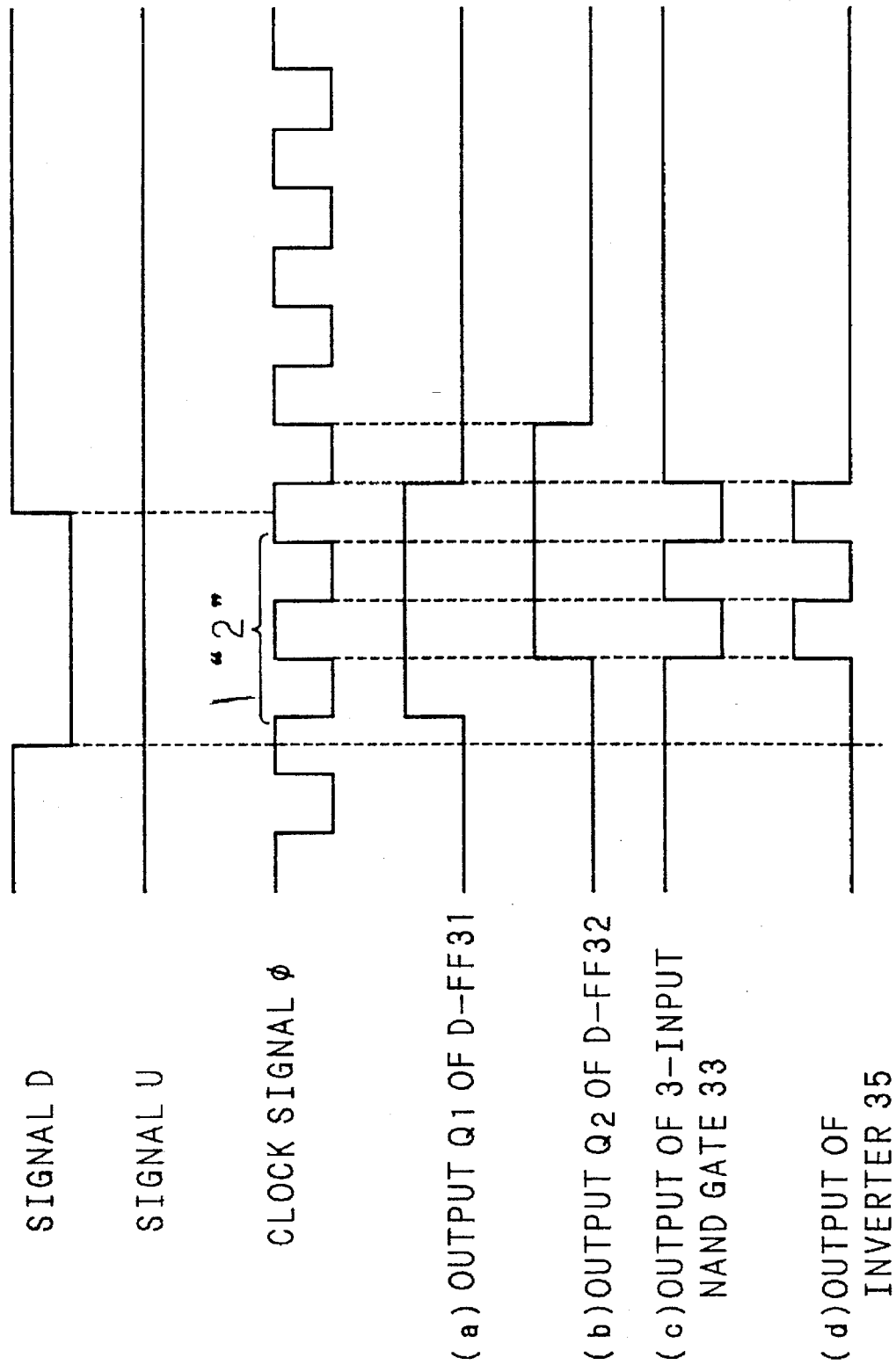
FIG. 8 is a timing chart of the pulse generator shown in FIG. 6.

FIG. 8 is a timing chart showing the operation of generating a pulse corresponding to the signal D in the pulse generator 7 shown in FIG. 6. The output $Q_1$ of the D-FF 31 is made "H" as shown in (a) of FIG. 8 at a first falling edge of the clock signal ϕ after a falling edge of the signal D, and the output $Q_2$ of the D-FF 32 is made "H" as shown in (b) at the rising edge after the elapse of a half period. The output $Q_1$ of the D-FF 31 is made "L" as shown in (a) of FIG. 8 at the next but one falling edge of the clock signal ϕ, and the output $Q_2$ of the D-FF 32 is made "L" as shown in (b) of FIG. 8 at the rising edge after the elapse of a half period. During the period in which both the outputs $Q_1$ and $Q_2$ are "H", the 3-input NAND gate 33 is opened so that two positive pulses of the clock signal φ pass through the gate. In this way, when two negative-pulse periods of the clock signal φ exist during an "L" level period of the signal D as indicated by "2" in FIG. 8, two pulse signals are output. The output pulses of the 3-input NAND gate 33 are negative pulses as shown in (c), and passed through the inverter 35 to become positive pulses as shown in (d). The output pulses are then input to the counter 8 to function as subtrahend "2". The output of the 3-input NAND gate 33 which is shown in (c) is input to the counter 8. In the case that the signal D is output, however, the output of the inverter 35 does not function as addend "2" because the 3-input AND gate 37a is closed.

As described above with reference to FIGS. 7 and 8, when there are m low-level periods of the clock signal φ during "L" level period of the signal U (D), the pulse generator 7 outputs m pulse signals.

The counter 8 consists of an R-S-FF 34, a NAND gate 45, and an up-down counter 51. In accordance with the signal U (D) supplied to the terminal S (R), the R-S-FF 34 sets its output $Q_3$ to be "H" ("L"). The output $Q_3$ is input to the up-down counter 51 to increment (or decrement) the contents of the counter. The NAND gate 45 receives a control signal and a reset signal from the control circuit, and sends the signals to the up-down counter 51 to instruct the setting of a value.

The up-down counter 51 is a known circuit consisting of a cascade connection of n stages of 1-bit block 42, and counts the number of pulses of the pulse signal generated by the pulse generator 7. The digital value corresponding to the objective oscillation frequency is input via input terminals $a_1, a_2, \ldots, a_n$, and the bits of the digital value are set in the n stages of 1-bit block 42 in response to the reset signal or the control signal, respectively. The pulse signal generated by the pulse generator 7 is input as an addend pulse or a subtrahend pulse to the first stage of 1-bit block 42. The output $Q_3$ of the R-S-FF 34 is input to each of the n stages of 1-bit block 42 as a signal for closing or opening gates through which the addend pulse or the subtrahend pulse passes. The counting results of the n stages of 1-bit block 42 are output to the next stages of 1-bit block 42, and also to the converter 9 via output terminals $b_1, b_2, \ldots, b_n$, respectively.

The first stage of 1-bit block 42 consists of inverters 36 and 38, NAND gates 40 and 41, a T-FF 39, and the 2-AND-NOR gate 37. The 2-AND-NOR gate 37 is composed of the 3-input AND gates 37a and 37b, and a NOR gate 37c. The 3-input AND gate 37a functions as a gate through which the addend pulse passes, and to which the output (negative pulse) of the 3-input NAND gate 33 of the pulse generator 7 and the output $Q_3$ of the R-S-FF 34 are input. When the signal U is input, the gate is opened. The 3-input AND gate 37b functions as a gate through which the subtrahend pulse passes, and to which the output (positive pulse) of the inverter 35 of the pulse generator 7 is input and also the output $Q_3$ of the R-S-FF 34 is input via the inverter 36. When the signal D is input, the gate is opened. The control signal Z which is normally "H" is supplied to both the gates 37a and 37b. The outputs of the gates 37a and 37b are passed through the NOR gate 37c and the inverter 38 to be inverted in polarity two times, and then input to the T-FF 39. Accordingly, the outputs of the gates 37a and 37b and the inverter 38 have the same polarity.

The T-FF 39 is a flip-flop which operates at a rising edge. Therefore, the T-FF 39 functions as an upcounter when a negative pulse is input, and as a downcounter when a positive pulse is input.

When the digital value corresponding to the objective oscillation frequency is to be set in the counter 8, the signal supplied to the input terminal $a_1$ of the first stage of 1-bit block 42 is supplied together with the reset signal or the control signal supplied via the NAND gate 45, to the $\overline{R}$ terminal of the T-FF 39 via the NAND gate 40, and further supplied together with the reset signal or the control signal, to the $\overline{S}$ terminal of the T-FF 39 via the NAND gate 41. When this signal is "0", the T-FF 39 is set, and, when this signal is "1", the T-FF 39 is reset.

The next and subsequent stages of 1-bit block 42 have the same configuration as that of the first stage of 1-bit block 42 except that the outputs $\overline{Q}$ (negative pulse) and Q (positive pulse) of the T-FF 39 of the previous stage are respectively input to the 3-input AND gates 37a and 37b. Also in these stages, therefore, a pulse which has passed through the 3-input AND gate 37a (or 37b) is incremented (or decremented) in the same manner as the first stage 1-bit block 42.

Figure 9:
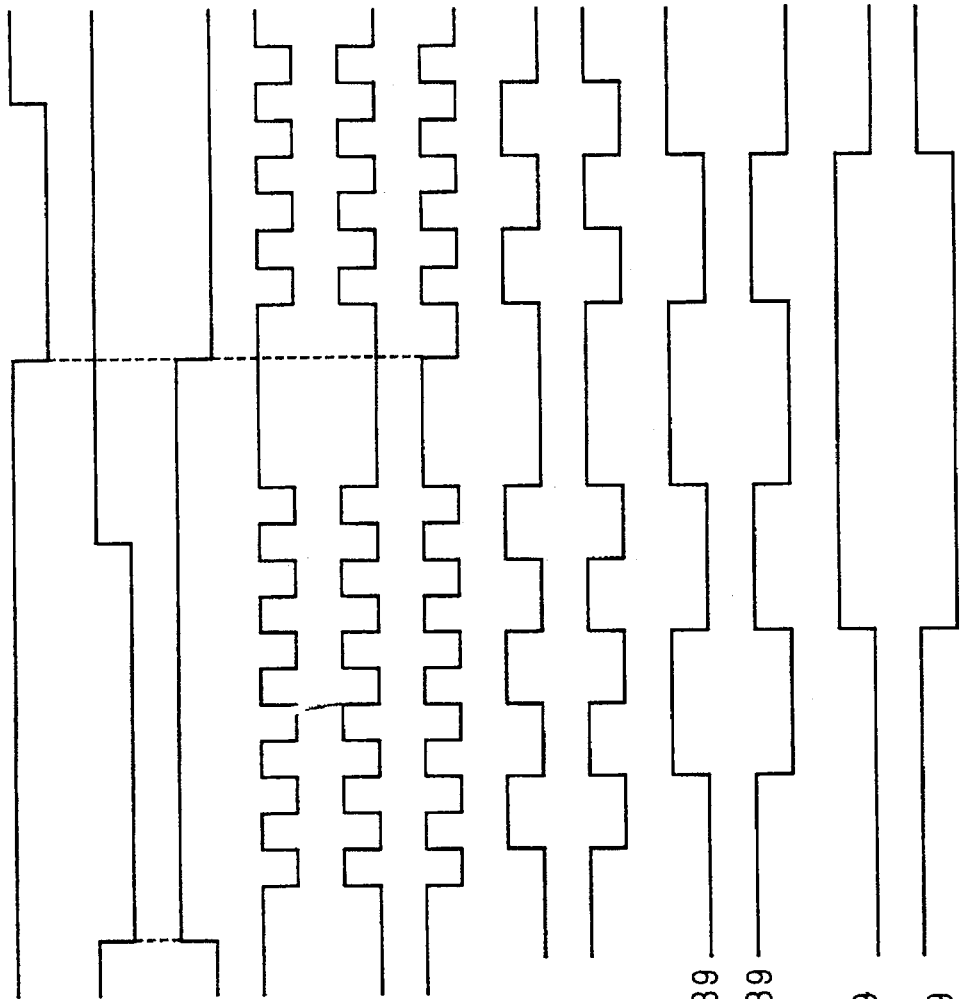
FIG. 9 is a timing chart of the counter shown in FIG. 6.

FIG. 9 is a timing chart showing the operation of the counter 8 shown in FIG. 6 in which a value "X" is set. The count operation will be described with reference to FIGS. 6 and 9.

When the signal U is made "L" level, the R-S-FF 34 is caused to enter the set state by the falling edge of the signal, so that the output $Q_3$ becomes "H" as shown in (a) of FIG. 9, whereby the 3-input AND gate 37a is opened. The 6 output pulses (negative pulses) ((b) of FIG. 9) of the 3-input NAND gate 33 which are the pulse signal generated by the pulse generator 7 in accordance with the signal U pass through the 3-input AND gate 37a, and then supplied to the T-FF 39 via the NOR gate 37c and the inverter 38. As shown in (b) and (d), the outputs of the 3-input NAND gate 33 and the inverter 38 have the same polarity.

Since a negative pulse is input to the T-FFs 39 of the first, next, and next but one stages as shown in (d), (f) and (h) of FIG. 9, these T-FFs 39 function as an upcounter, and the count value becomes "X+6" as shown in (j). Even when the signal U is made "H" level, the R-S-FF 34 remains to be in the set state as shown in (a).

When the signal D is made "L" level, the R-S-FF 34 is caused to enter the reset state, so that the output $Q_3$ becomes "L" as shown in (a) of FIG. 9. Therefore, the 3-input AND gate 37a is closed and also its output becomes "L", so that time output of the inverter 38 becomes "L" as shown in (d). The "L" of the output $Q_3$ is inverted to "H" by the inverter 36, so that the 3-input AND gate 37b is opened. The 4 output pulses (positive pulses) ((c) of FIG. 9) of the inverter 35 which are the pulse signals generated by the pulse generator 7 in accordance with the signal D pass through the 3-input AND gate 37b, and then supplied to the T-FF 39 via the NOR gate 37c and the inverter 38.

Since a positive pulse is input to the T-FFs 39 of the first, next, and next but one stages as shown in (c), (e) and (g) of FIG. 9, these T-FFs 39 function as a downcounter, and the count value becomes "X+2" as shown in (j). The outputs Q of the T-FFs 39 of the first, next, and next but one stages are output via the output terminals $b_1, b_2$ and $b_3$ to the converter 9 as shown in (e), (g) and (i), respectively.

As described above, the counter 8 operates so as to increment the pulse signal generated in accordance with the signal U, and decrement the pulse signal generated in accordance with the signal D.

Figure 10:
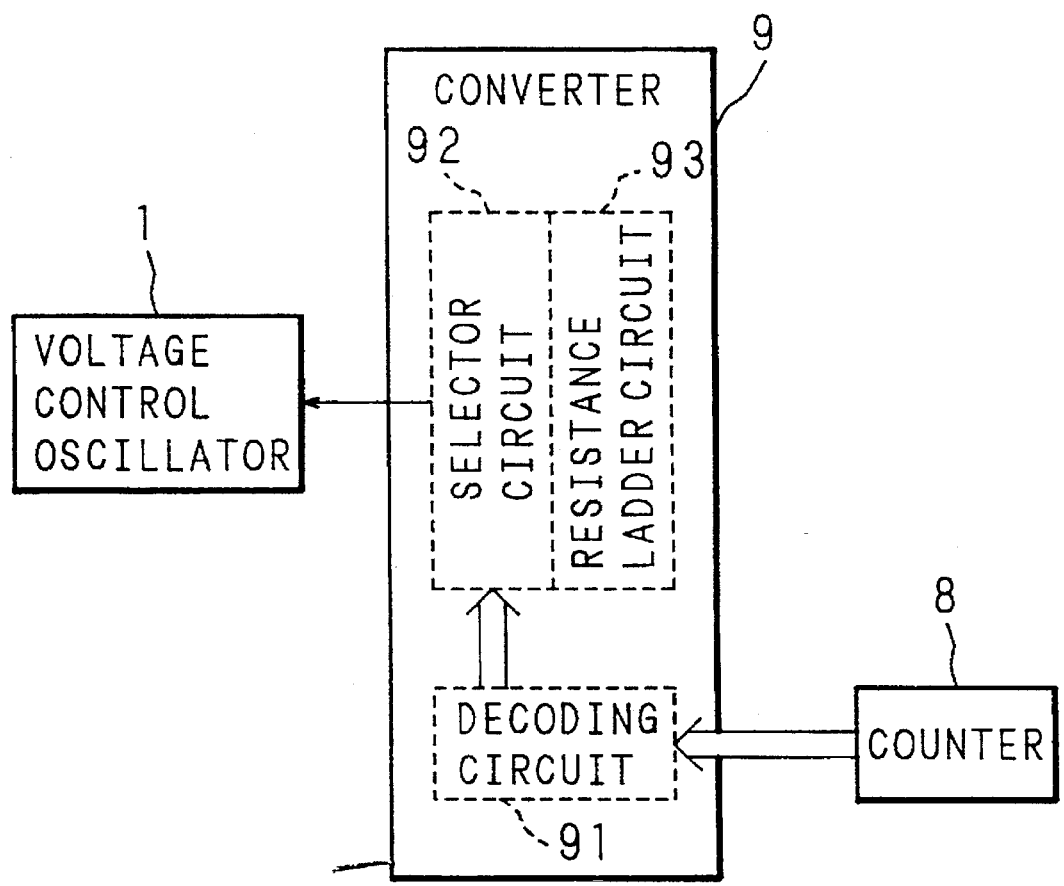
FIG. 10 is a block diagram of a converter shown in FIG. 5 and the vicinity of the converter.

FIG. 10 is a block diagram of the converter 9 shown in FIG. 5 and the vicinity of the converter.

The counter 8 is connected to a decoding circuit 91 by n data lines so that the count value of the counter 8 is input to the decoding circuit 91. The decoding circuit 91 is connected to a selector circuit 92 by a plurality of decode signal lines. The count value is decoded by the decoding circuit 91, and the decoded value is output to the selector circuit 92 via the decode signal lines. A resistance ladder circuit 93 is a ladder-like resistance potential divider from which a voltage required for the control of the voltage control oscillator 1 is supplied to the selector circuit 92. The selector circuit 92 selects a voltage corresponding to the decoded value input from the decoding circuit 91 out of the voltages supplied from the resistance ladder circuit 93, and outputs the selected voltage to the voltage control oscillator 1. According to this configuration, the voltage corresponding to the value which is set to the counter 8 is feedbacked to the voltage control oscillator 1, whereby the objective oscillation frequency is accurately maintained. Even when the oscillation frequency is deviated, the deviation amount is counted in the set value, and therefore a feedback voltage which has a wide operating range and which is correct can be obtained immediately.

In the first embodiment, when the output of the reference signal from the reference signal generator 2 is stopped, the stop state is detected by the reference signal stop detector 10 and the control signal Z of "L" level is supplied to the 2-AND-NOR gate 37 of the counter 8. As seen from FIG. 6, this causes the 2-AND-NOR gate 37 of the counter 8 to block the pulse signal from the pulse generator 7 or the outputs Q and $\bar{Q}$ of the T-FF 39 of the previous stage. Therefore, the up-down counter 51 stops the count operation, and continuously supplies the count value obtained at this time to the converter 9 which in turn continuously feedbacks the conversion voltage obtained at this time to the voltage control oscillator. In this way, even when the supply of a signal functioning as the reference is stopped, the voltage control oscillator 1 continues to oscillate at the oscillation frequency obtained at that time. Accordingly, even in the case of a stop of a reference signal, the whole of circuits including the PLL circuit is not disturbed, and the PLL circuit is excellent in stability.

Figure 11:
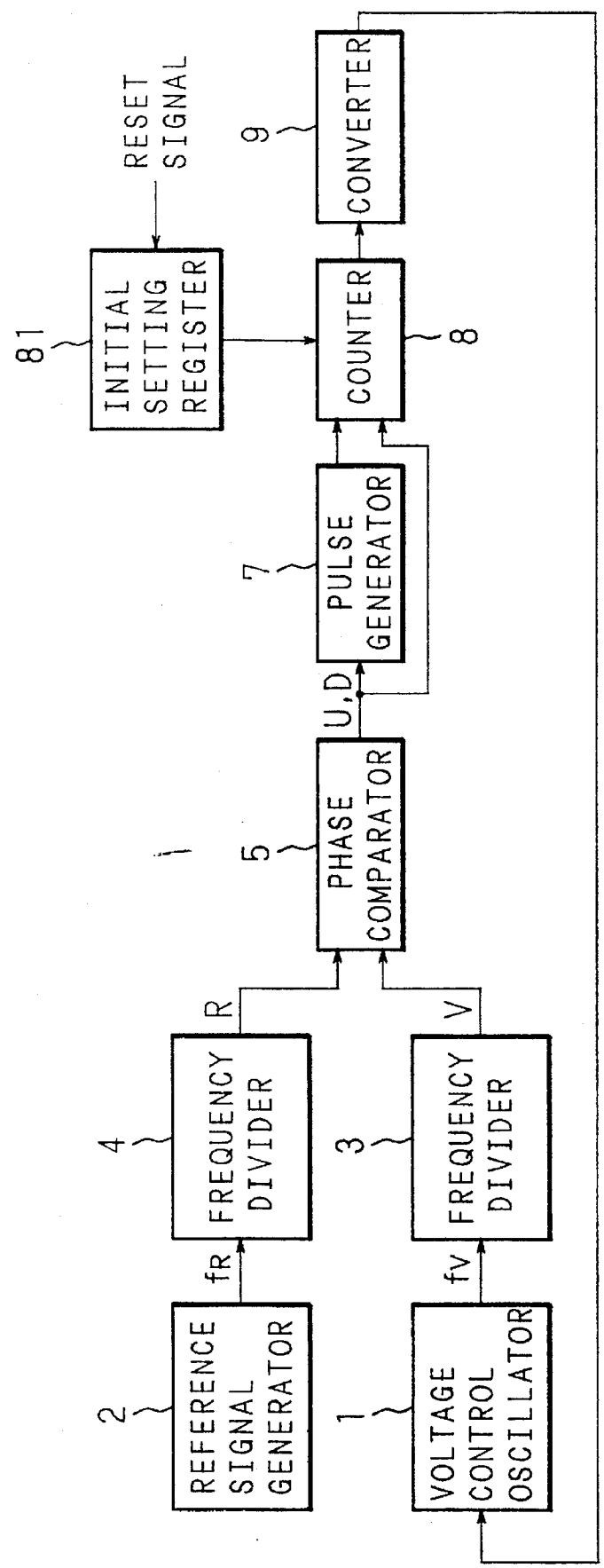
FIG. 11 is a block diagram of a PLL circuit of a second embodiment of the invention.

FIG. 11 is a block diagram of a second embodiment of the invention. The portions of FIG. 11 which are identical with those of FIG. 5 are designated by the same reference numerals, and their description is omitted.

An initial setting register 81 is a register for storing as an initial value a value corresponding to the objective oscillation frequency which is obtained at the time when the counter 8 is reset. The initial setting register 81 consists of n bits and is connected to the counter 8. It is so configured that the reset signal is input to the initial setting register 81. In the second embodiment, the initial value which is to be set to the counter 8 is previously stored in the initial setting register 81. The initial value is caused to be set to the counter 8 by the reset signal. Then the voltage control oscillator 1 oscillates at the frequency $f_V$ corresponding to the initial value.

In the second embodiment, stored is an initial value corresponding to the objective oscillation frequency which is obtained at the time when the counter is reset. When the operation of the counter is to be restarted, therefore, the initial value is rapidly set so that the response is further improved.

Figure 12:
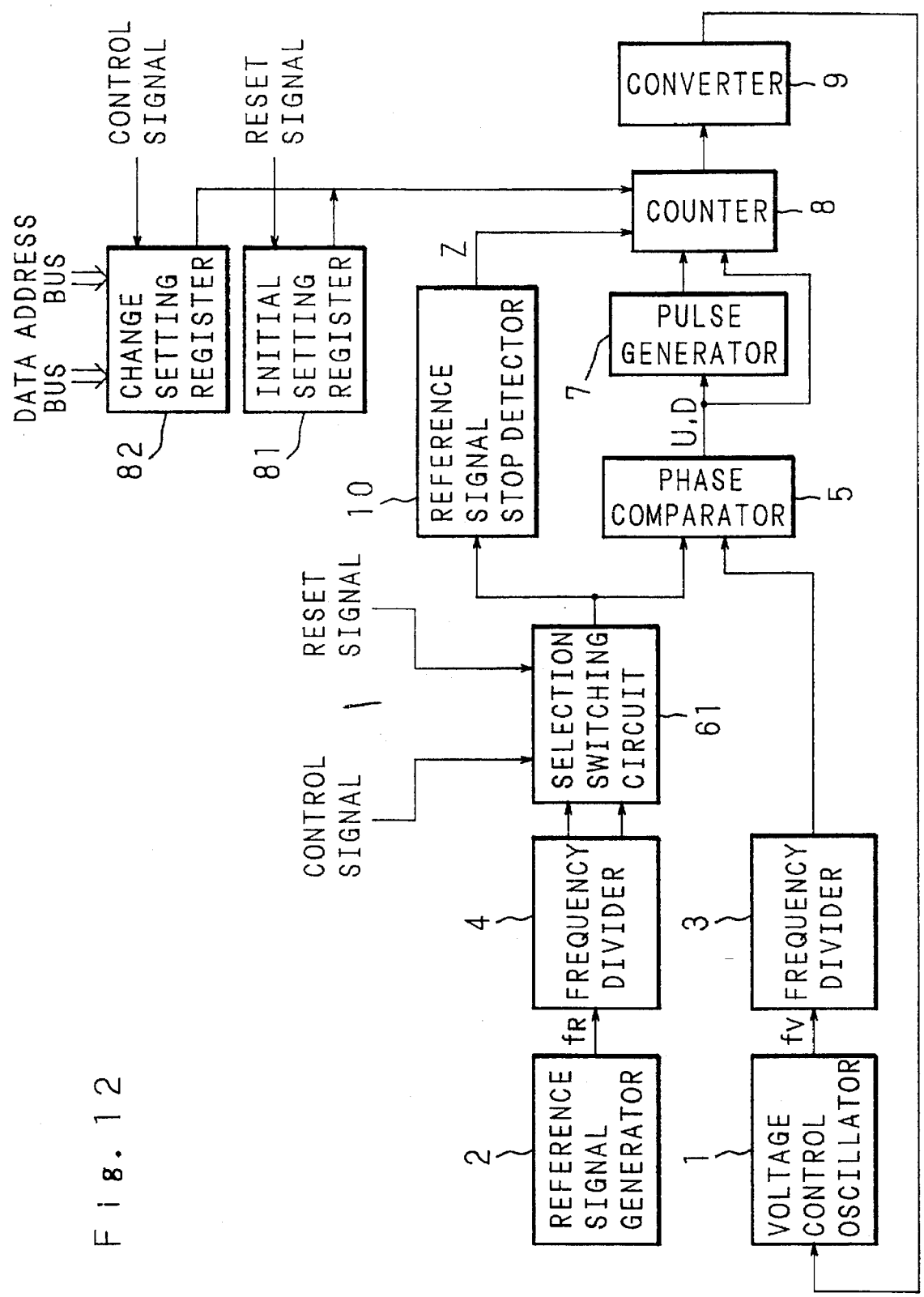
FIG. 12 is a block diagram of a PLL circuit of a third embodiment of the invention.

FIG. 12 is a block diagram of a third embodiment of the invention. The portions of FIG. 12 which are identical with those of FIGS. 5 and 11 are designated by the same reference numerals, and their description is omitted.

The frequency divider 4 produces outputs of a plurality of frequencies which are obtained by dividing the output frequency $f_R$ of the reference signal generator 2, and supplies the outputs to a selection switching circuit 61. The selection switching circuit 61 selects the output of the frequency corresponding to the objective oscillation frequency and functioning as the reference, from the outputs of the plurality of frequencies of the frequency divider 4, and supplies the selected output to the phase comparator 5. When the reset signal is given, the output of the frequency corresponding to the value of the initial setting register 81 and functioning as the reference is selected, and, when the control signal is given, the output of the frequency corresponding to the value of a change setting register 82 and functioning as the reference is selected. In each case, the selected output is supplied to the phase comparator 5.

The change setting register 82 is a register for storing as a change value a value corresponding to $f_V'$ to which the objective oscillation frequency is to be changed. The change value is supplied via a data bus from the control circuit which is not shown. In the same manner as the initial setting register 81, the change setting register 82 consists of n bits and is connected to the counter 8. It is so configured that the reset signal is input to the initial setting register 81, and the control signal to the change setting register 82.

The initial value which is to be set to the counter 8 is previously stored in the initial setting register 81. The initial value is caused to be set to the counter 8 by the reset signal. At the same time, the selection switching circuit 61 is caused by the reset signal to select or switch the signal corresponding to the initial value and functioning as the reference and supply the selected signal to the phase comparator 5. Then the voltage control oscillator 1 oscillates at the frequency $f_V$ corresponding to the initial value.

The change value for switching the objective oscillation frequency is given from the control circuit, and stored in the change setting register 82. The change value is caused to be set to the counter 8 by the control signal. At the same time, the selection switching circuit 61 is caused by the control signal to select and switch the signal corresponding to the change value and functioning as the reference and supply the selected signal to the phase comparator 5. Then the voltage control oscillator 1 oscillates at the frequency $f_V'$ corresponding to the change value. In this way, the operation of switching the oscillation frequency can be conducted in accordance with the reset signal and the control signal, and therefore the switching operation can be conducted rapidly, easily and surely.

In the third embodiment, values respectively corresponding to a plurality of objective oscillation frequencies are previously stored in the register, and a desired value is selected from the register. Accordingly, a value can immediately be set to the counter, thereby facilitating the control of switching the oscillation frequency. In other words, the third embodiment is excellent in controllability.

In the above, the embodiment having two registers for storing values corresponding to objective oscillation frequencies has been described. The number of the registers may be three or more. In the alternative, by providing means for selecting the signal functioning as the reference, the whole of circuits including the PLL circuit can be constructed in either of various circuit configurations in which a number of frequencies are selectively switched.

As described above, according to the invention, a stable oscillation can be maintained by setting a value corresponding to the objective oscillation frequency to a counter. When the oscillation frequency is deviated, the deviation amount is immediately counted in the set value. Even when the deviation amount is large, therefore, the oscillation frequency can rapidly be returned to the objective oscillation frequency, thereby providing a PLL circuit which does not run away and which is excellent in response.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A PLL circuit comprising:

phase comparing means for detecting a phase difference between a signal relating to an output of a voltage control oscillator and a reference signal, and discriminating between a phase lead and a phase lag;

pulse generating means for generating a pulse signal having pulses a number of which corresponds to the phase difference detected by said phase comparing means;

counting means for incrementing or decrementing a value which is previously set, by said number of pulses in accordance with the discrimination between the phase lead and the phase lag which is detected by said phase comparing means;

converting means for converting a count value of said counting means into a voltage corresponding to the count value, and feeding the voltage back to said voltage control oscillator; and storage means for previously storing an initial value and setting the initial value to said counting means in response to a reset signal.

2. A PLL circuit comprising:

voltage control oscillating means for oscillating at a frequency corresponding to an input voltage;

first frequency dividing means for dividing the oscillation frequency of said voltage control oscillating means;

reference signal generating means for outputting a reference signal;

second frequency dividing means for dividing an output frequency of said reference signal generating means;

phase comparing means for detecting a phase difference between an output signal of said first frequency dividing means and an output signal of said frequency dividing means, and discriminating between a phase lead and a phase lag;

pulse generating means for generating a pulse signal having pulses a number of which corresponds to the phase difference detected by said phase comparing means;

counting means for incrementing or decrementing a value which is previously set, by said number of pulses in accordance with the discrimination between the phase lead and the phase lag which is detected by said phase comparing means;

converting means for converting a count value of said counting means into a voltage corresponding to the count value, and feeding the voltage back to said voltage control oscillating means; and storage means for previously storing an initial value and setting the initial value to said counting means in response to a reset signal.

3. A PLL circuit comprising:

phase comparing means for detecting a phase difference between a signal relating to an output of a voltage control oscillator and a reference signal, and discriminating between a phase lead and a phase lag;

pulse generating means for generating a pulse signal having pulses a number of which corresponds to the phase difference detected by said phase comparing means;

counting means for incrementing or decrementing a value which is previously set, by said number of pulses in accordance with the discrimination between the phase lead and a phase lag which is detected by said phase comparing means;

converting means for converting a count value of said counting means into a voltage corresponding to the count value, and feeding the voltage back to said voltage control oscillator;

storage means for storing a plurality of values which are to be set to said counting means; and means for selecting a desired value from said storage means, and setting the selected value to said counting means in response to a reset signal.

4. A PLL circuit according to claim 3, wherein said storage means comprises an initial register for previously storing an initial value which is set to said counting means, and a change register for storing as a change value a value other than the initial value.

5. A PLL circuit according to claim 4, wherein, in response to a reset signal, the initial value which is stored in said initial register is set to said counting means, and, in response to a control signal, the change value which is stored in said change register is set to said counting means.

6. A PLL circuit comprising:

voltage control oscillating means for oscillating at a frequency corresponding to an input voltage;

first frequency dividing means for dividing the oscillation frequency of said voltage control oscillating means;

reference signal generating means for outputting a reference signal;

second frequency dividing means for dividing an output frequency of said reference signal generating means, and outputting a plurality of frequency signals;

selecting means for selecting a frequency signal corresponding to an objective oscillation frequency and functioning as a reference, from outputs of said second frequency dividing means;

phase comparing means for detecting a phase difference between an output signal of said first frequency dividing means and an output signal of said selecting means, and discriminating between a phase lead and a phase lag;

pulse generating means for generating a pulse signal having pulses a number of which corresponds to the phase difference detected by said phase comparing means;

counting means for incrementing or decrementing a value which is previously set, by the number of pulses in accordance with the discrimination between the phase lead and the phase lag which is detected by said phase comparing means;

converting means for converting a count value of said counting means into a voltage corresponding to the count value, and feeding the voltage back to said voltage control oscillating means;

storage means for storing a plurality of values which are to be set to said counting means; and means for selecting a desired value from said storage means, and setting the selected value to said counting means in response to a reset signal.

7. A PLL circuit according to claim 6, wherein said storage means comprises an initial register for previously storing an initial value which is set to said counting means, and a change register for storing as a change value a value other than the initial value.

8. A PLL circuit according to claim 7, wherein, in response to a reset signal, a frequency signal corresponding to the initial value which is stored in said initial register and functioning as the reference is selected by said selecting means, and the initial value is set to said counting means, and, in response to a control signal, a frequency signal corresponding to the change value which is stored in said change register and functioning as the reference is selected by said selecting means, and the change value is set to said counting means.

* * * * *